(12) United States Patent
Wakashima

(10) Patent No.: US 11,153,523 B2
(45) Date of Patent: Oct. 19, 2021

(54) IMAGE CAPTURING APPARATUS AND METHOD OF CONTROLLING THE SAME, AND STORAGE MEDIUM

(71) Applicant: CANON KABUSHIKI KAISHA, Tokyo (JP)

(72) Inventor: Shunichi Wakashima, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/009,888

(22) Filed: Sep. 2, 2020

(65) Prior Publication Data

US 2021/0067721 A1 Mar. 4, 2021

(30) Foreign Application Priority Data

Sep. 4, 2019 (JP) .............................. JP2019-161462

(51) Int. Cl.
| | |
|---|---|
| *H04N 5/378* | (2011.01) |
| *H04N 5/374* | (2011.01) |
| *H01L 27/146* | (2006.01) |
| *H03M 1/56* | (2006.01) |
| *H04N 5/3745* | (2011.01) |

(52) U.S. Cl.
CPC .............. *H04N 5/378* (2013.01); *H03M 1/56* (2013.01); *H04N 5/37455* (2013.01); *H04N 5/37457* (2013.01)

(58) Field of Classification Search
CPC .............. H04N 5/378; H04N 5/37455; H04N 5/37457; H03M 1/56; H01L 26/14612; H01L 27/14614; H01L 27/14641
USPC .... 348/308, 300, 301, 302, 294, 297, 229.1; 257/291, 292, 293, 443; 250/208.1
See application file for complete search history.

(56) References Cited

U.S. PATENT DOCUMENTS

| | | | |
|---|---|---|---|
| 5,717,458 A | 2/1998 | Yonemoto | |
| 6,061,093 A | 5/2000 | Yonemoto | |
| 9,848,145 B2 * | 12/2017 | Kamehara | H04N 5/362 |
| 9,948,879 B2 * | 4/2018 | Hirai | H04N 5/378 |
| 10,027,916 B2 * | 7/2018 | Ishiwata | H04N 5/37457 |
| 2010/0253821 A1 * | 10/2010 | Yamamoto | H04N 5/378 |
| | | | 348/294 |
| 2011/0074994 A1 * | 3/2011 | Wakabayashi | H04N 5/335 |
| | | | 348/302 |
| 2018/0108658 A1 * | 4/2018 | Hanzawa | |
| 2018/0234652 A1 * | 8/2018 | Sugawa | H04N 5/37457 |
| 2020/0260030 A1 * | 8/2020 | Masaki | H04N 5/37455 |

(Continued)

FOREIGN PATENT DOCUMENTS

JP H07-283386 A 10/1995

*Primary Examiner* — Marly S Camargo
(74) *Attorney, Agent, or Firm* — Venable LLP

(57) ABSTRACT

An image capturing apparatus includes a pixel array, an AD converter, an output line configured to connect the pixel and the AD converter, a reset unit configured to reset the output line, an amplification transistor configured to amplify a signal from the pixel, a connection unit configured to connect a source of the amplification transistor to the output line, a constant current source, and a control unit configured to, after a voltage of the output line is reset, cause a constant current to flow to the output line and to control to connect a source of the amplification transistor to the output line, wherein the control unit sets a value of the constant current so that the constant current is a lower value than a current required to drive the output line.

13 Claims, 12 Drawing Sheets

(56) References Cited

U.S. PATENT DOCUMENTS

2021/0144330 A1\* 5/2021 Otaka .................. H04N 5/3745
2021/0159258 A1\* 5/2021 Makashima ...... H01L 27/14612

\* cited by examiner

IMAGE CAPTURING APPARATUS AND METHOD OF CONTROLLING THE SAME, AND STORAGE MEDIUM

BACKGROUND OF THE INVENTION

Field of the Invention

The present invention relates to a technique for reducing power consumption in an image capturing apparatus.

Description of the Related Art

One signal conversion method used by a CMOS image sensor in an image capturing apparatus such as a digital camera is a column AD conversion method in which a signal voltage outputted from a pixel is converted in a column parallel manner to a digital signal by AD (analog-to-digital) converters arranged in their respective column. Also, one column AD conversion method is a column single-slope AD conversion method in which a pixel output is inputted to a comparator arranged at each column and a common RAMP signal is inputted to each column, and then the time it takes for the comparator to invert is counted for every column to obtain a digital signal that corresponds to an output voltage of each pixel.

Also, as disclosed in Japanese Patent Laid-Open No. H7-283386, for example, a capacitive load operation in which a capacitor is employed in a load of an amplification transistor (source follower: hereinafter SF) of a pixel when a signal voltage is outputted (output line driving) from a pixel is known. In this output line driving method, a constant current is not made to flow; therefore, power consumption can be reduced compared to a case where a constant current source circuit is employed in an SF load.

However, because a pixel output voltage continues to fluctuate in the capacitive load operation due to an SF subthreshold current, if the time it takes from a start of the output line driving to a sampling in an AD conversion is not made to be constant, an output signal linearity will degrade. On this point, because a sampling timing varies depending on the signal voltage in the above column AD conversion method, a linearity degradation cannot be avoided.

Thus, although in a case where the column AD conversion method in which the sampling timing varies depending on the signal voltage and a method in which the capacitive load operation is employed in the output line driving are used in combination, power consumption can be reduced, it was difficult to obtain a sufficient linearity of the output signal.

SUMMARY OF THE INVENTION

The present invention is made in light of the problems described above and achieves both the reduction of power consumption and the linearity of the output signal in a pixel signal readout operation in an image capturing element that employs the column AD conversion method in which the sampling timing varies.

According to a first aspect of the present invention, there is provided an image capturing apparatus comprising: a pixel array in which a plurality of a pixel are arranged in a form of a two-dimensional array; an AD converter configured to AD-convert a voltage; an output line configured to connect the pixel and the AD converter; a reset circuit configured to reset a voltage of the output line; an amplification transistor configured to amplify a signal from a charge-voltage converter of the pixel; a connection circuit configured to connect a source of the amplification transistor to the output line; a constant current source configured to supply a constant current to the output line; and a controller configured to, after a voltage of the output line is reset by the reset circuit, cause a constant current to flow to the output line by the constant current source and to control to connect a source of the amplification transistor to the output line, wherein the controller sets a value of the constant current so that a current value of the constant current is a lower value than a current value required to drive the output line.

According to a second aspect of the present invention, there is provided a method for controlling the image capturing apparatus having a pixel array in which a plurality of pixels are arranged in a form of a two-dimensional array, an AD converter configured to AD-convert a voltage, an output line configured to connect the pixel and the AD converter, a reset circuit configured to reset a voltage of the output line, an amplification transistor configured to amplify a signal from a charge-voltage converter of the pixel, a connection circuit configured to connect a source of the amplification transistor to the output line, and a constant current source configured to supply a constant current to the output line, the method comprising: controlling to cause a constant current to flow to the output line by the constant current source and to connect a source of the amplification transistor in the output line after a voltage of the output line is reset by the reset circuit, wherein in the controlling, a value of the constant current is set so that a current value of the constant current is a lower value than a current value required to drive the output line.

Further features of the present invention will become apparent from the following description of exemplary embodiments with reference to the attached drawings.

DESCRIPTION OF THE EMBODIMENTS

Figure 1:
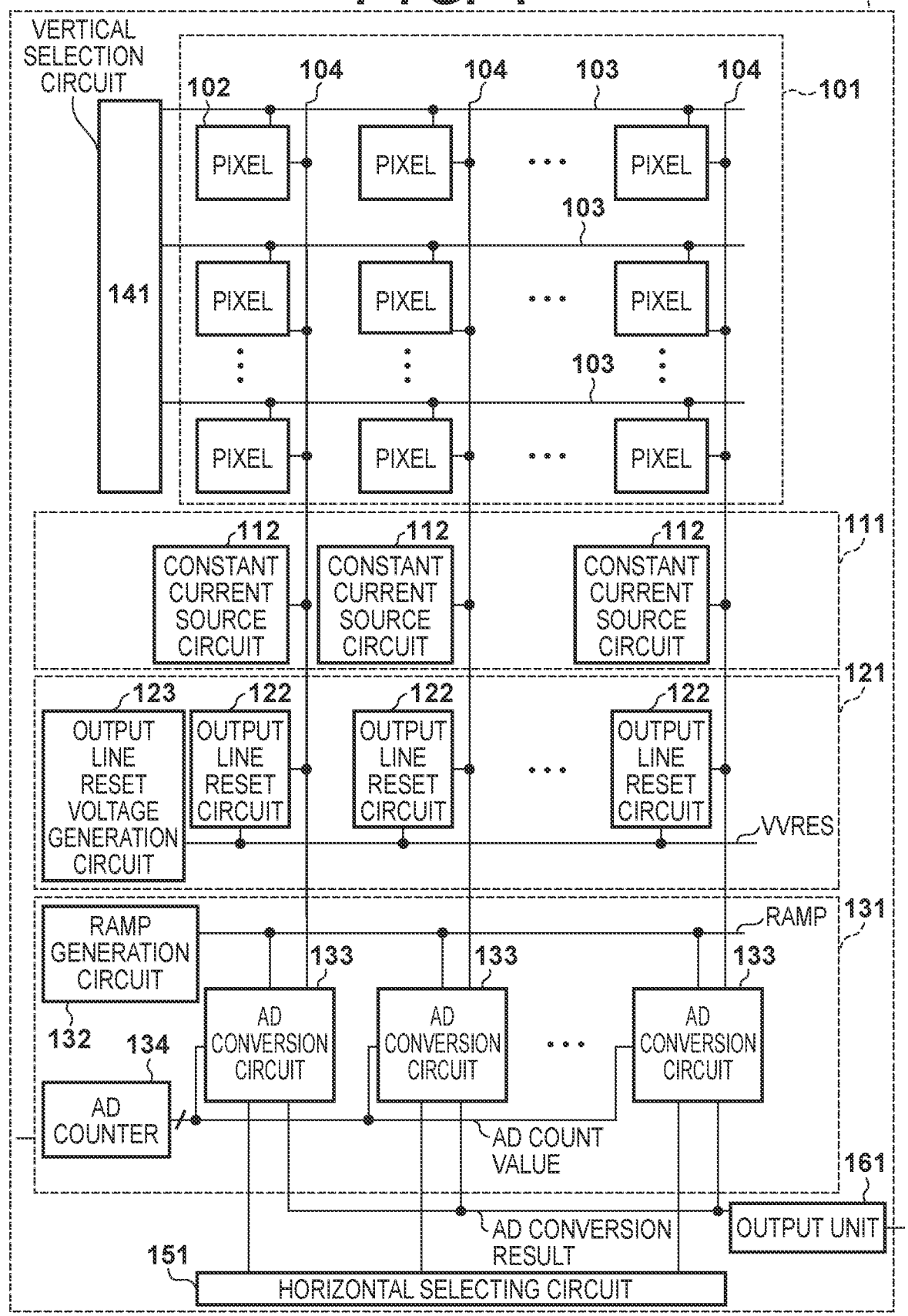
FIG. 1 is a schematic diagram illustrating an overall configuration of an image capturing element according to a first embodiment of the present invention.

Embodiments of the present invention will be described hereinafter in detail, with reference to the accompanying drawings. Note that the following embodiments do not limit the invention according to the scope of the appended claims. Although a plurality of features are described in the embodiments, not all of the plurality of features are essential to the present invention, and the plurality of features may be arbitrarily combined. Furthermore, in the attached drawings, the same reference numerals are assigned to the same or similar configurations, and an overlapping description is omitted.

[Overall Configuration of Image Capturing Element]

FIG. 1 is a schematic diagram illustrating an overall configuration of an image capturing element 100 of a first embodiment employed in an image capturing apparatus of the present invention.

The image capturing element 100 comprises a pixel array portion 101, a constant current source circuit unit 111, an output line reset circuit unit 121, an AD conversion unit 131, a vertical selection circuit 141, a horizontal selection circuit 151, and an output unit 161.

The pixel array portion 101 comprises a pixel 102 arranged in form of a two-dimensional array. An output from the vertical selection circuit 141 inputted to pixels arranged in a row direction via a pixel driving pulse line 103 causes a pixel selection switch of a predetermined row to turn on, then an amplification transistor of a predetermined row is connected to an output line 104. The output line 104 can be arranged so that there is one line for every pixel array, one line for every plurality of pixel arrays, or a plurality of lines for every pixel array. Also, it is possible to arrange the same number of an AD conversion circuit 133 as the number of pixels then arrange the output line 104 for every pixel.

The constant current source circuit unit 111 comprises a constant current source circuit 112 arranged at every output line 104. The output line reset circuit unit 121 comprises an output line reset circuit 122 arranged at every output line and an output line reset voltage generation circuit 123. A configuration may be taken so as not to arrange the output line reset voltage generation circuit 123 and supply an output line reset voltage VVRES from outside the image capturing element 100 or a configuration may be taken so as to omit the output line reset voltage generation circuit 123 by setting VVRES to a ground voltage.

The AD conversion unit 131 comprises a RAMP generation circuit 132, the AD conversion circuit 133 arranged at every output line, and a counter 134.

In the image capturing element 100 configured in this way, a two-dimensional image signal is read out as follows. First, a row to be read out is selected by the vertical selection circuit 141, and an output voltage of a pixel in the selected row is converted into a digital signal in the AD conversion circuit 133 then held. A digital signal of a column sequentially selected by the horizontal selection circuit 151 is outputted to the outside the image capturing element 100 via the output unit 161. By sequentially performing this operation while changing the row selected by the vertical selection circuit 141, the image signal is read out.

[Pixel and AD Conversion Unit]

Figure 2:
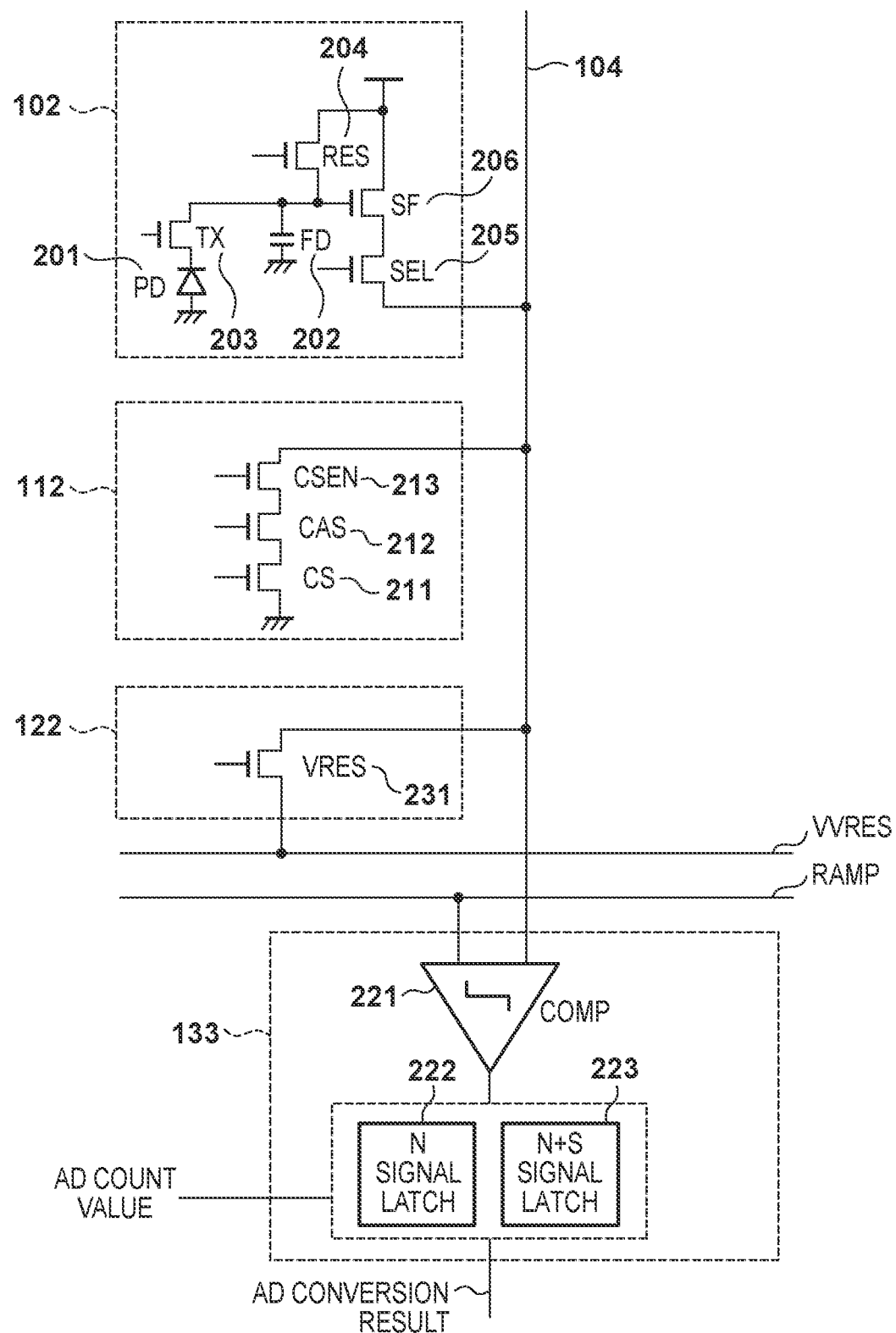
FIG. 2 is a schematic diagram of a pixel, a constant current source circuit, an output line reset circuit, and an AD conversion circuit of the image capturing element according to the first embodiment.
Figure 3:
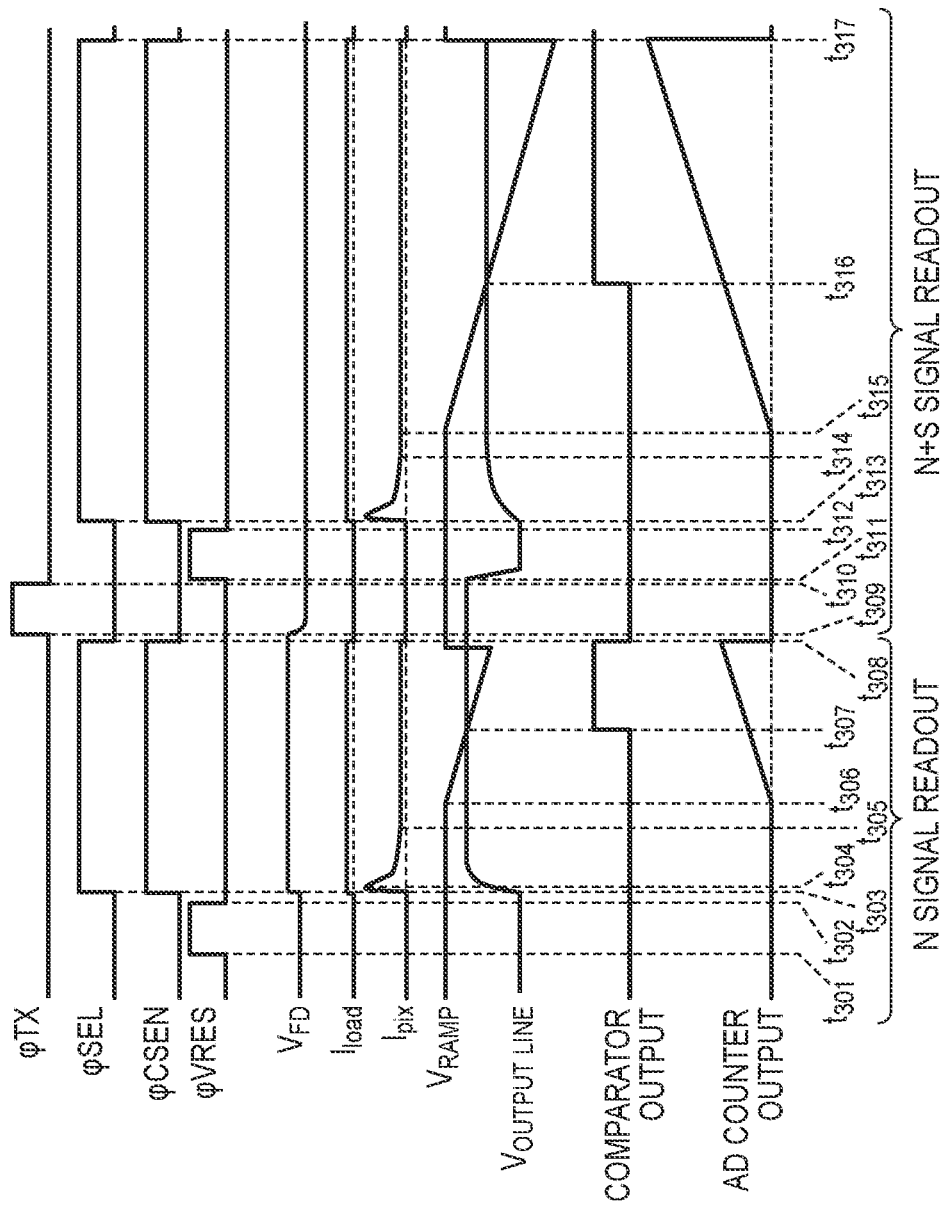
FIG. 3 is a timing chart for describing a pixel signal readout in the first embodiment.

Next, regarding a pixel signal readout in the present embodiment, a description is given using FIGS. 2 and 3.

FIG. 2 is a diagram schematically illustrating the pixel 102, the constant current source circuit 112, the output line reset circuit 122, and the AD conversion circuit 133 in the present embodiment.

The pixel 102 comprises a photodiode (hereinafter PD) 201 serving as a photoelectric converter, a charge-voltage converter (a floating diffusion unit: hereinafter FD) 202 that converts a signal charge to a signal voltage, a transfer switch (hereinafter, TX) 203 that transfers (transfer operation) a charge accumulated in the photoelectric converter to the FD 202. The pixel 102 further comprises a reset transistor (hereinafter RES) 204 for resetting the FD 202, a pixel selection switch (hereinafter SEL) 205 for selecting a pixel, and an amplification transistor (source follower: hereinafter SF) 206 for outputting a signal voltage from a pixel.

The constant current source circuit 112 comprises a constant current source transistor (hereinafter CS) 211, a cascode transistor (hereinafter CAS) 212, and a current source switch (hereinafter CSEN) 213.

An AD conversion method is a single-slope AD conversion method, and the AD conversion circuit 133 comprises a comparator 221, an N signal latch circuit 222, and an N+S signal latch circuit 223. Note that the present invention is effective in any AD conversion method in which the sampling timing varies due to voltage, and the method does not necessarily have to be the single-slope AD conversion method.

The output line reset circuit 122 comprises an output reset transistor (hereinafer VRES) 231 consisting of an NMOS transistor. However, limitation is not made to this, and depending on the VVRES voltage, a configuration may be taken so as to arrange the NMOS transistor and the PMOS transistor in parallel or arrange the PMOS transistor.

FIG. 3 is a timing chart for describing a pixel signal readout operation in the embodiment. t301 to t317 in FIG. 3 show each timing (time) in the timing chart, and in the present embodiment, each timing is shown as t301 or the like. Also, ΦTX shows turning on and turning off of the TX and is shown to be a high level when on and a low level when off. The same applies to other switches. A VFD shows how a voltage of the FD 202 changes, and similarly, a VRAMP and a V output line also show how voltages of a VRAMP and an output line change.

An Iload shows how a current value flowing in the constant current source circuit 112 changes, and an Ipix shows how a current value flowing in the SF 206 changes. The pixel signal readout comprises an N signal readout and an N+S signal readout. An N signal is a signal that corresponds to the VFD before a charge accumulated in the PD 201 is transferred, and an N+S signal is a signal that corresponds to the VFD after a charge accumulated in the PD 201 is transferred. By calculating the difference between the N signal and the N+S signal, a signal corresponding to a charge amount accumulated in the PD 201 can be obtained. With reference to the timing chart in FIG. 3, operation of an N signal readout and an N+S signal readout will be described below, in that order.

N Signal Readout (t301 to t308)

First, the VRES 231 is turned on, and then before the output line 104 is driven, the output line 104 is reset (reset operation: t301) to the output line reset voltage VVRES which is set to be lower than a voltage expected as a signal voltage. The VVRES may be decided from a lower limit of an AD conversion voltage range or decided from a voltage corresponding to an expected maximum light amount, or configured to be a ground voltage.

After the VRES 231 is turned off (t302), the CSEN 213 is turned on, and the Iload is made to flow in an output line. Also, by turning the SEL 205 on to connect the SF 206 and the output line 104, an N signal drive which sets the V output line to a voltage corresponding to the VFD before the charge accumulated in the photoelectric converter is transferred is started (t303). Immediately after the driving is started, gate-source voltage of the SF 206 is large, and the Ipix is also large (t304). Then, as time elapses, the output line voltage increases due to a difference between the Ipix and the Iload. The voltage increase stops when the Ipix and the Iload become equal (t305).

After a sufficient amount of time for ensuring the voltage increase has stopped, the RAMP generation circuit 132 is operated to lower the RAMP voltage VRAMP at a constant rate and the AD counter 134 is operated to count time in an AD count value (t306). When the VRAMP reaches the same voltage as the V output line, the comparator 221 inverts, then the AD count value is stored in the N signal latch circuit 222 (t307). Next, the CSEN 213 and the SEL 205 are turned off (t308). An output line reset period (t301 to t302) before the N signal is driven, an N signal driving period (t303 to t305), and an N signal AD conversion period (t306 to t308) combined are referred to as the N signal readout.

N+S Signal Readout (t309 to t317)

The TX 203 is turned on (t309) and off (t310), and then a charge accumulated in the PD 201 is transferred to the FD 202. The VFD drops in accordance with a transferred charge amount. Next, the VRES 231 is turned on (t311) and off (t312), and then the output line 104 is reset to the VVRES.

Next, the SEL and the CSEN are turned on again, and then an N+S signal driving which sets the V output line to a voltage corresponding to the VFD after the charge accumulated in the PD 201 is transferred is started (t313). Similarly to when the N signal is driven, when the Ipix and the Iload become equal, the output line voltage stops (t314) increasing. Then, by the RAMP generation circuit 132 and the AD counter 134 being operated (t315), the time it takes for the comparator 221 to invert is counted and then stored (t316) in the N+S signal latch circuit 223. After the RAMP generation circuit 132 and the AD counter 134 are operated to a voltage corresponding to the expected maximum light amount, the CSEN 213 and the SEL 205 are turned off (t317). The charge transfer (t309 to t310), the output line reset before the N+S signal is driven (t311 to t312), the N+S signal driving (t313 to t314), and the N+S signal AD conversion (t315 to t317) combined are referred to as the N+S signal readout.

During the signal driving, the SF 206 drives the output line 104, and during the AD conversion period, the constant current source circuit 112 stabilizes the V output line to a constant voltage. In other words, during the signal driving, Ipix-Iload drives the output line 104, and during the AD conversion period, the Iload causes the SF 206 gate-source voltage to be constant. Because the Iload does not drive the output line 104, the Iload does not require a large current. When the sum of the output line 104 and a capacitor connected to the output line 104 is C, a difference in the voltages between the read N signal and N+S signal is dV, and, when the time (t303 to t306, t313 to t315) it takes from when the output line driving is started to when the AD conversion is started is dt, the Iload is a smaller current than a current expressed by:

$$C \times dV/dt$$

By this, the power consumption by a constant current is reduced.

After the pixel signal readout has been completed, by a sequential selection of columns by the horizontal selection circuit 151, the N signal and the N+S signal stored in an N signal latch and an N+S signal latch of the selected column are outputted from the image capturing element via the output unit 161. A difference between the outputted N signal and N+S signal is calculated, and a signal corresponding to the charge accumulated in the photoelectric converter is obtained. Also, a configuration may be taken where a difference calculation circuit is arranged in the image capturing element 100 and then the difference between the N signal and the N+S signal is outputted from the image capturing element 100.

Here, a comparison between the present embodiment and a conventional technique is performed. As conventional techniques for comparison, a readout method (referred to as a first conventional example in the present specification) in which the column AD conversion circuit and the output line driving by a capacitive load operation are combined and a readout method (referred to as a second conventional example in the present specification) in which the column AD conversion circuit and the output line driving by a constant current are combined are shown.

First, a difference between the present embodiment and the first conventional example will be described with reference to FIGS. 4 and 5.

Figure 4:
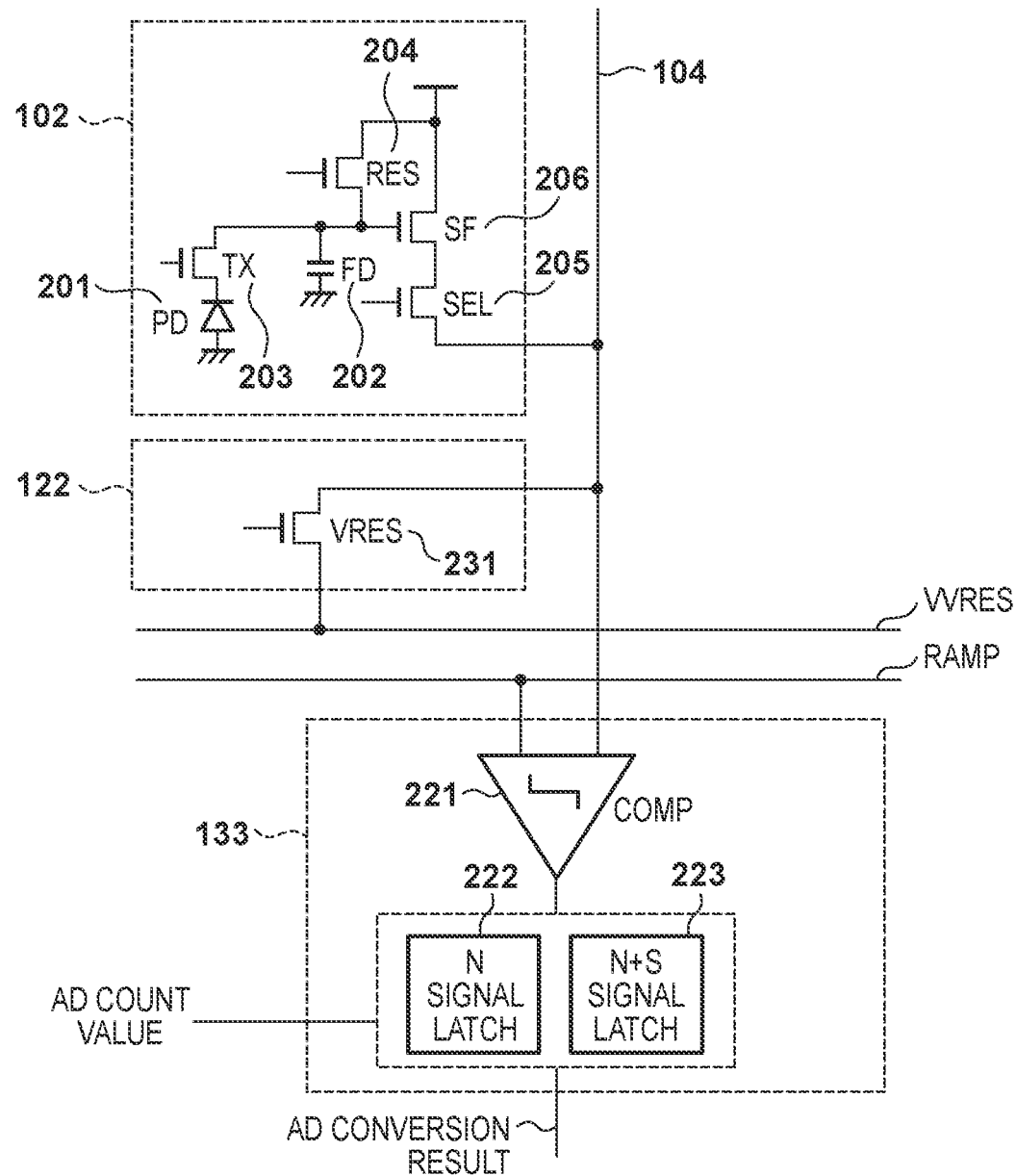
FIG. 4 is a schematic diagram of a pixel, an output line reset circuit, and an AD conversion circuit of an image capturing element in a first conventional example.
Figure 5:
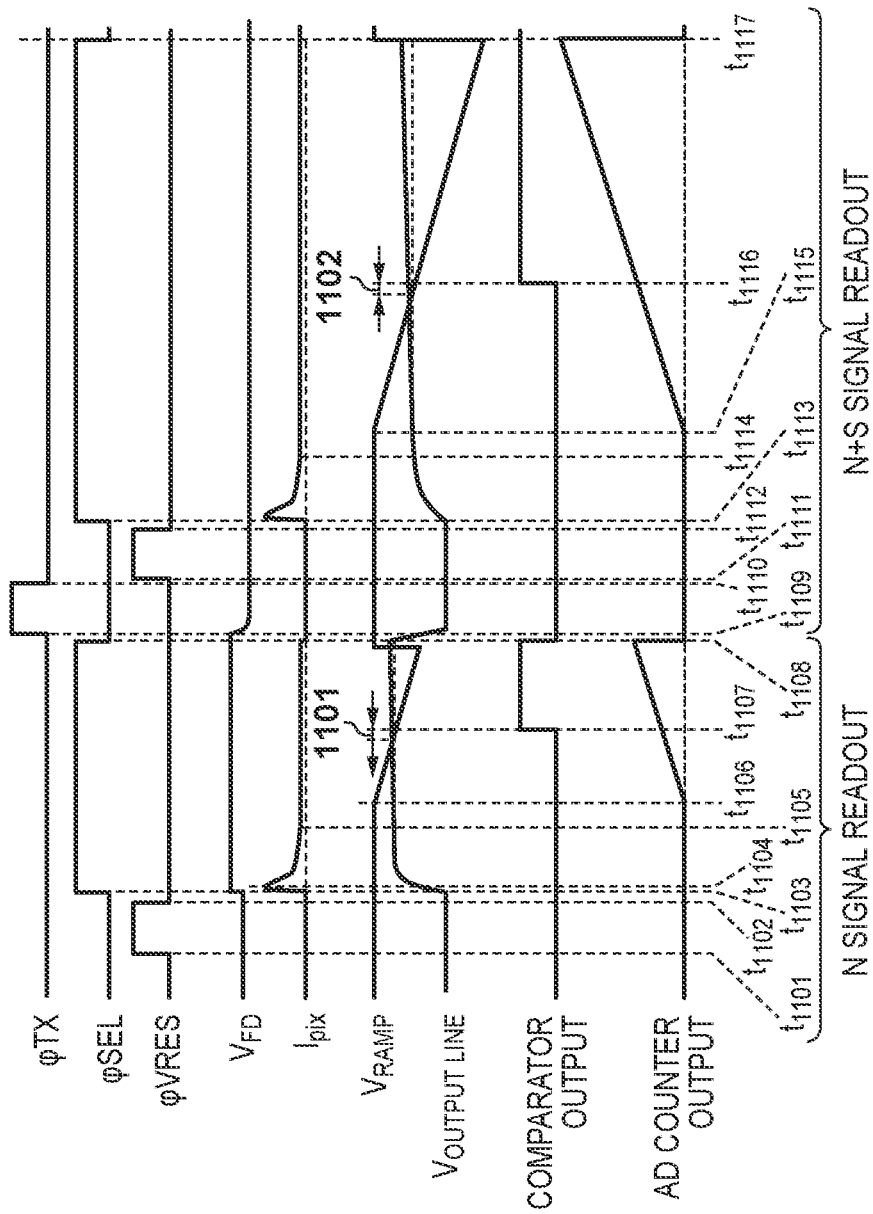
FIG. 5 is a timing chart for describing a pixel signal readout in the first conventional example.

FIG. 4 is a diagram schematically illustrating the pixel 102, the output line reset circuit 122, and the AD conversion circuit 133 of the first conventional example, and FIG. 5 is a timing chart of the first conventional example. A waveform indicated by a dashed line in the V output line in FIG. 5 is a waveform showing how the output line voltage changes in the present embodiment.

A readout circuit configuration in FIG. 4 compared to the configuration (FIG. 2) of the present embodiment has a circuit configuration without the constant current source circuit 112, so that after the output line driving is terminated (t1105, t1114), Ipix will continue to flow in the output line 104. As indicated by a dashed line in FIG. 5, the constant current Iload is made to flow to the output line 104 in the present embodiment, so the V output line in the AD conversion period (t1106 to t1108, t1115 to t1117) is at a constant voltage. Therefore, even if the AD sampling timing varies, a problem does not occur. On the other hand, because a constant current Iload is not made to flow in the output line 104 in the first conventional example, the V output line continues to change in the AD conversion period in accordance with the change in Ipix. Thus, when compared to the readout method of the present embodiment wherein the V output line is constant, the V output line and the VRAMP voltages become equal, thereby creating a time shift as to when the comparator inverts. In FIG. 5, a time shift indicated by 1101 is a shift in the N signal, and a time shift indicated by 1102 is a shift in the N+S signal. Because this shift amount varies depending on the amount of time from the start (t1103, t1113) of the signal readout, the linearity of the output signal is degraded.

Next, a difference between the present embodiment and a second conventional example will described with reference to FIG. 6 and FIG. 7.

Figure 6:
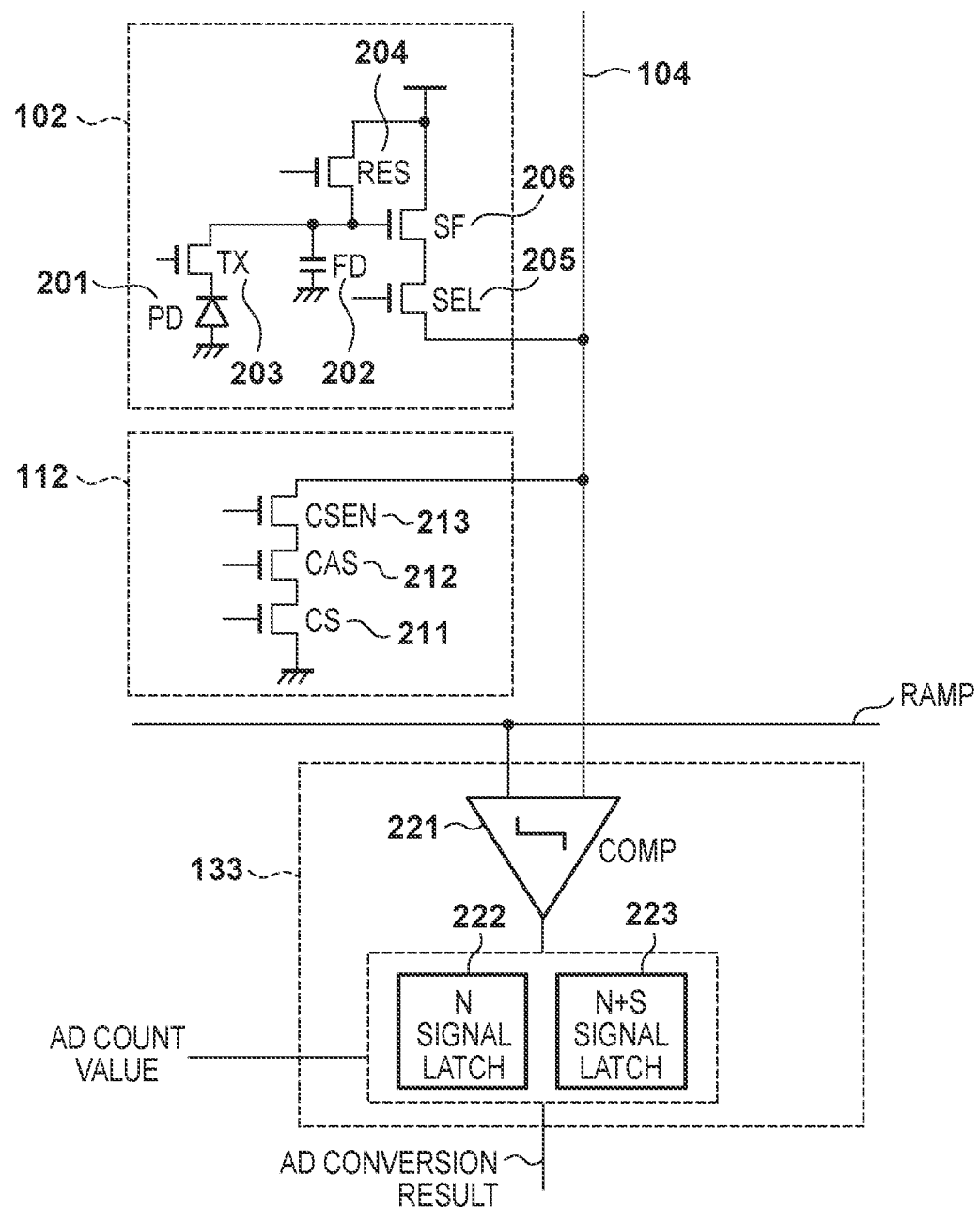
FIG. 6 is a schematic diagram of a pixel, a constant current source circuit, and an AD conversion circuit of an image capturing element in a second conventional example.
Figure 7:
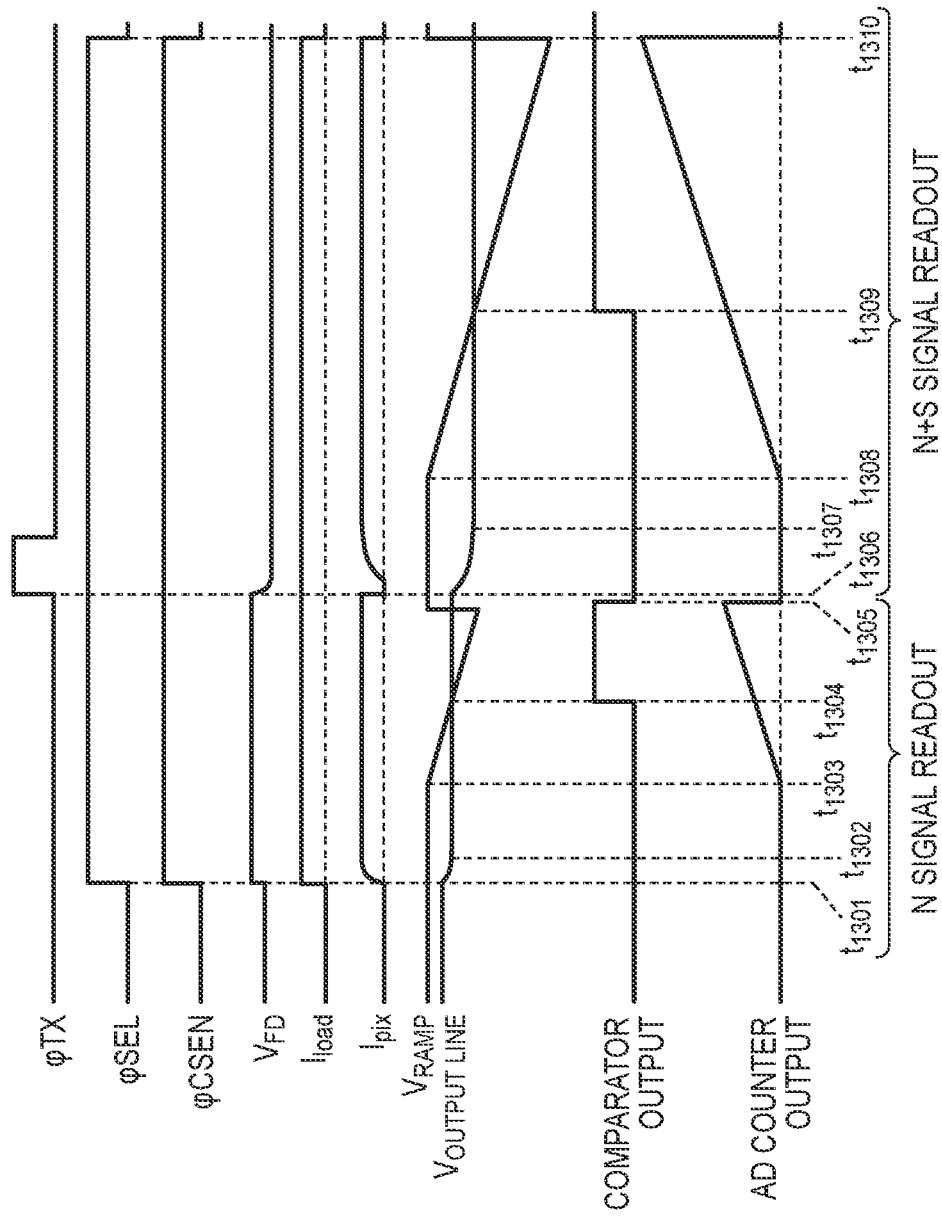
FIG. 7 is a timing chart for describing a pixel signal readout in the second conventional example.

FIG. 6 is a diagram schematically illustrating the constant current source circuit 112 and the AD conversion circuit 133 of the second conventional example, and FIG. 7 is a timing chart of the second conventional example.

A readout circuit configuration in FIG. 6 compared to the present embodiment has a configuration without the output line reset circuit 122. Additionally, in the timing chart in FIG. 7, compared to the timing chart in FIG. 3, the times (t1301 to t1302, t1309 to t1310) for performing the output line reset are omitted. Thus, although the time it takes to read out the pixel signal is shorter than the pixel signal readout operation in the present embodiment, the constant current source circuit 112 drives the output line 104 during the signal driving, and the constant current source circuit 112 stabilizes the V output line at a constant voltage in the AD conversion period. In other words, not only does the Iload cause the SF 206 gate-source voltage to be constant in the AD conversion period but also Iload-Ipix drives (t1301 to t1302, t1306 to t1307) the output line during the signal driving; therefore, the Iload needs to be made larger. When a total capacity of an output line node is C, a difference in the voltages between the read N signal and N+S signal is dV, and the time (t1301 to t1302, t1306 to t1307) it takes from when the output line driving is started to when the AD conversion is started is dt, it is typical to employ a larger current than a current expressed by:

$$C \times dV/dt$$

for Iload.

On the other hand, in the pixel signal readout operation of the present embodiment it can be set to a current smaller than a current expressed by:

$$C \times dV/dt$$

Therefore, the power consumption related to the pixel signal readout can be reduced compared to the second conventional example.

Also, by setting the Iload in the circuit configuration in FIG. 2 in advance to be switchable, it becomes possible to switch between and use of the readout method of the present embodiment and the method of the second conventional example. Also when switching the readout method, because a current flowing in the SF 206 in the respective AD conversion periods varies, it is advantageous to, when the RES 204 is on, switch a voltage applied to a gate in order to switch the reference voltage for when resetting the FD 202.

Also, when the output line is driven, the V output line increases in the readout method of the present embodiment and the V output line decreases in the second conventional example. Therefore, a driving direction of the RAMP is to be in an increasing direction in the readout method of the present embodiment and in a decreasing direction in the second conventional example. By this, in either readout method, when a driving voltage amplitude is small, the time from the start of the driving until the sampling is short, and when the driving voltage amplitude is large, the time from the start of the driving until the sampling is long. Therefore, by setting the driving direction of the RAMP to be in the increasing direction in the readout method of the present embodiment and in a decreasing direction in the second conventional example, even if the driving is incomplete in a case where a signal amplitude is large, the AD conversion can be started from the time when the driving is completed in a case where signal amplitude is small, and thereby is advantageous.

As described above, by performing the above pixel signal readout, in a column AD conversion method in which the sampling timing varies such as the column single-slope AD conversion method, both a reduction of power consumption related to the pixel signal readout and linearity of the output signal can be achieved.

Second Embodiment

Figure 8:
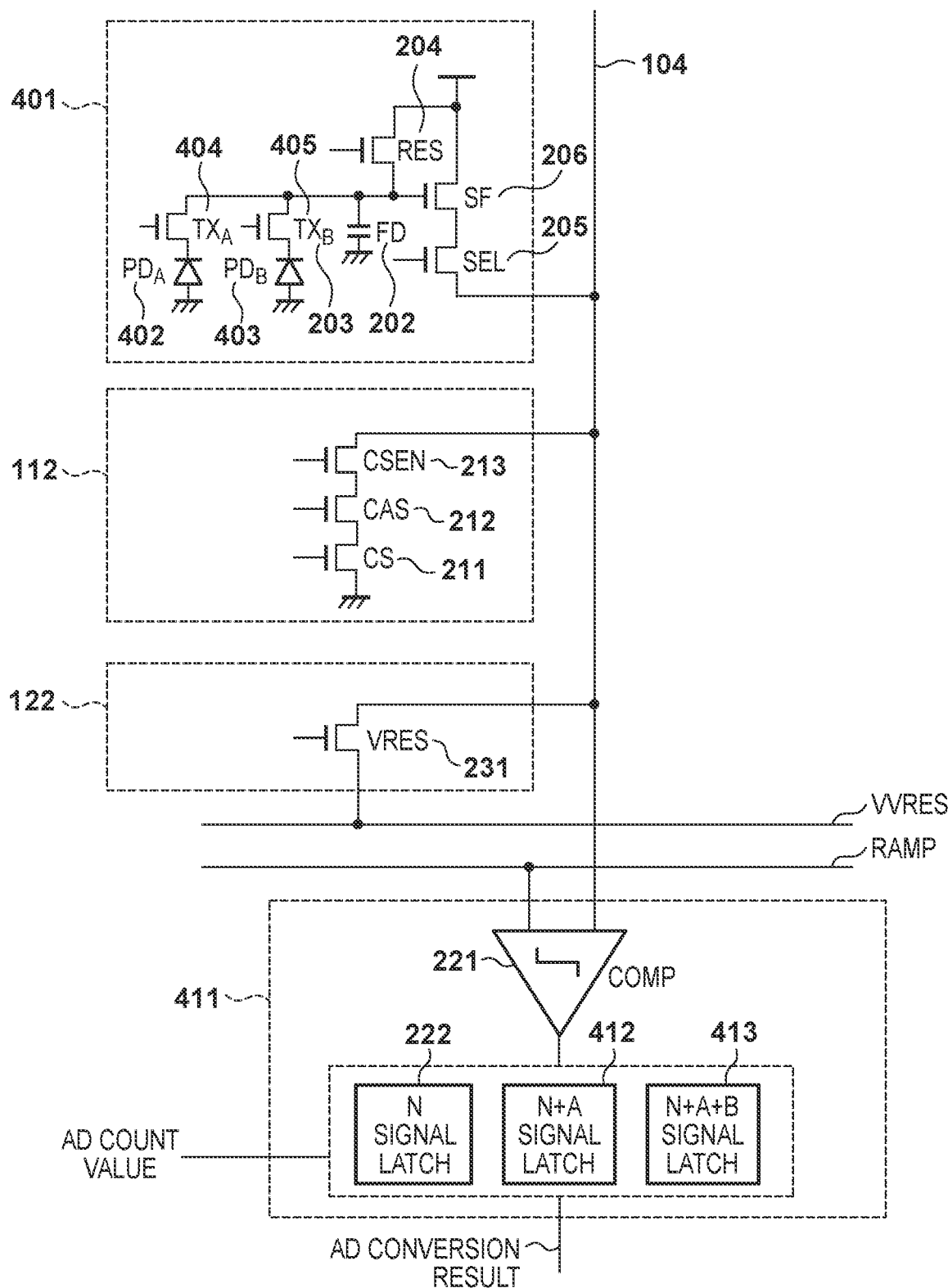
FIG. 8 is a schematic diagram of a pixel, a constant current source circuit, an output line reset circuit, and an AD conversion circuit of the image capturing element according to the second embodiment.
Figure 9:
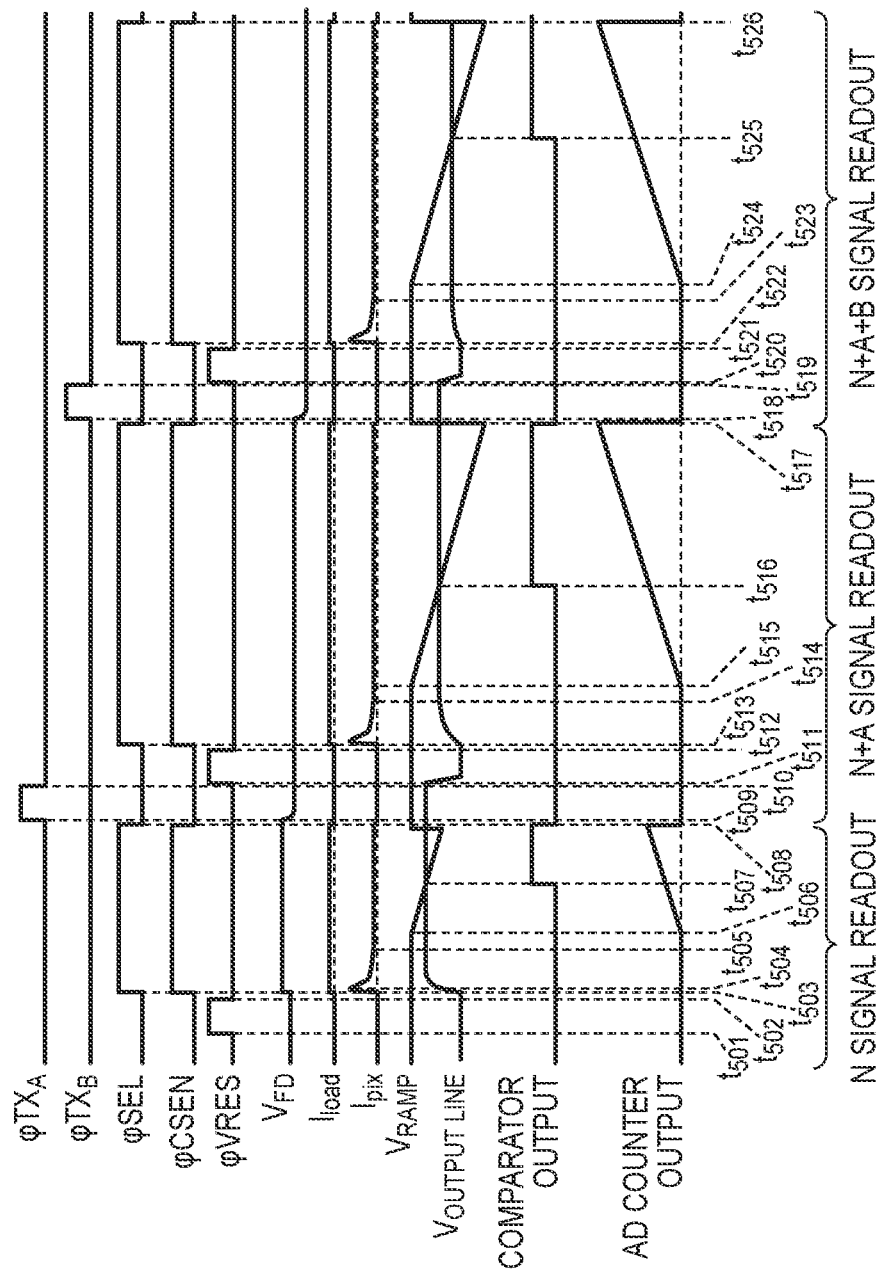
FIG. 9 is a timing chart for describing a pixel signal readout in the second embodiment.

FIGS. 8 and 9 are used to describe the second embodiment. In the present embodiment, a single pixel comprises a single microlens and a multiply divided sub photoelectric converters, and a case where an image capturing element that is able to acquire an imaging plane phase-difference signal is used is described. A plurality of sub photoelectric converters are configured so as to receive light from different regions in an exit pupil of the image capturing lens via a single microlens. In this configuration, a focus detection can be performed by obtaining a phase-difference signal from an image shift amount of a signal of each sub photoelectric converter of the pupil division, and by adding the signal of each sub photoelectric converter, an image capturing signal can be obtained.

Although the overall configuration of the image capturing element 100 of the present embodiment is the same as that of the first embodiment, compared to the first embodiment, the pixel 102 has been changed to a pixel 401, and the AD conversion circuit 133 to an AD conversion circuit 411.

FIG. 8 is a diagram schematically illustrating the pixel 401, the constant current source circuit 112, the output line reset circuit 122, and the AD conversion circuit 411 in the present embodiment.

The pixel 401 comprises a PDA 402 and a PDB 403 which serve as sub photoelectric converters, a transfer switch (TXA) 404 which transfers a charge accumulated in the PDA 402 to the FD 202 and a transfer switch (TXB) 405 which transfers a charge accumulated in the PDB 403 to the FD 202. The pixel 401 further comprises the FD 202, the RES 204, the SEL 205, and the SF 206.

The AD conversion circuit 411 comprises the comparator 221, the N signal latch circuit 222, an N+A signal latch circuit 412, and an N+A+B signal latch circuit 413. Note that the constant current source circuit 112 and the output line reset circuit 122 are the same as the first embodiment.

FIG. 9 is a timing chart for describing the pixel signal readout and the AD conversion in the present embodiment. The pixel signal readout comprises the N signal readout, an N+A signal readout, and an N+A+B signal readout. The N+A signal is a signal that corresponds to the VFD after the charge accumulated in the PDA 402 is transferred, and the N+A+B signal in addition to the N+A signal is a signal that corresponds to the VFD after a charge accumulated in the PDB 403 is transferred. By calculating a difference between the N signal and the N+A signal, a signal corresponding to the charge amount accumulated in the PDA 402 can be obtained, and by calculating a difference between the N+A signal and the N+A+B signal, a signal corresponding to the charge amount accumulated in the PDB 403 can be obtained. Following the timing chart in FIG. 9, description will be given below of operation of the N signal readout, the N+A signal readout, and the N+A+B signal readout, in that order.

N Signal Readout (t501 to t508)

This is the same as the N signal readout of the first embodiment up until the N signal readout (t501 to t508).

N+a Signal Readout (t509 to t517)

The transfer switch TXA 404 is turned on (t509) and off (t510), and then a charge accumulated in the PDA 402 is transferred to the FD 202. The VFD drops in accordance with a transferred charge amount. Next, the VRES 231 is turned on (t511) and off (t512), and then the output line 104 is reset to the VVRES.

Next, the CSEN 213 and the SEL 205 are turned on again, and then an N+A signal driving which sets the V output line to a voltage corresponding to the FD voltage after the charge accumulated in the PDA 402 is transferred is started (t513). Similarly to when the N signal is driven, when the Ipix and the Iload become equal, the V output line stops (t514) increasing. Then, by the RAMP generation circuit 132 and the AD counter 134 being operated (t515), the time it takes for the comparator 221 to invert is counted and then stored (t516) in the N+A signal latch circuit 412. After the RAMP generation circuit 132 and the AD counter 134 are operated to a voltage corresponding to the expected maximum light amount, the CSEN 213 and the SEL 205 are turned off (t517). The charge transfer (t509 to t510) of the PDA 402, the output line reset before the N+A signal is driven (t511 to t512), the N+A signal driving (t513 to t514), and the N+A signal AD conversion (t515 to t517) combined are referred to as the N+A signal readout.

N+A+B Signal Readout (t518 to t526)

The transfer switch TXB 405 is turned on (t518) and off (t519), and then a charge accumulated in the PDB 403 is transferred to the FD 202. The VFD drops in accordance with a transferred charge amount. The VFD here compared to the VFD from when N signal is being driven has lowered proportionally to the total amount of charge transferred from the PDA 402 and the PDB 403. Next, the VRES 231 is turned on (t520) and off (t521), and then the output line 104 is reset to the output line reset voltage.

Next, the CSEN 213 and the SEL 205 are turned on again, and then an N+A+B signal driving which sets the V output line to a voltage corresponding to the VFD after the charge accumulated in the PDB 403 is transferred is started (t522). Similarly to when the N signal is driven, when the Ipix and the Iload become equal, the V output line stops (t523) increasing. Then, by the RAMP generation circuit 132 and the AD counter 134 being operated (t524), the time it takes for the comparator 221 to invert is counted and then stored (t525) in the N+A+B signal latch circuit 413. After the RAMP generation circuit 132 and the AD counter 134 are operated to a voltage corresponding to the expected maximum light amount, the CSEN 213 and the SEL 205 are turned off (t526). The PDB 403 charge transfer (t518 to t519), the output line reset (t520 to t521) before the N+A+B signal is driven, the N+A+B signal driving (t522 to t523), and the N+A+B signal AD conversion (t524 to t526) combined are referred to as the N+A+B signal readout.

After the pixel signal readout has been completed, by a sequential selection of columns by the horizontal selection circuit 151, the N signal, N+A signal, and the N+A+B signal stored in an N signal latch, N+A signal latch, and an N+A+B signal latch of the selected column are outputted from the image capturing element 100 via the output unit 161. By performing a difference calculation of the outputted N signal and N+A signal, a signal corresponding to a charge amount accumulated in the PDA can be obtained. Also, by performing a difference calculation of the N+A signal and the N+A+B signal, a signal corresponding to a charge amount accumulated in the PDB can be obtained.

Here, a focus detection method for a pupil division phase-difference detection method will be described.

Figure 10:
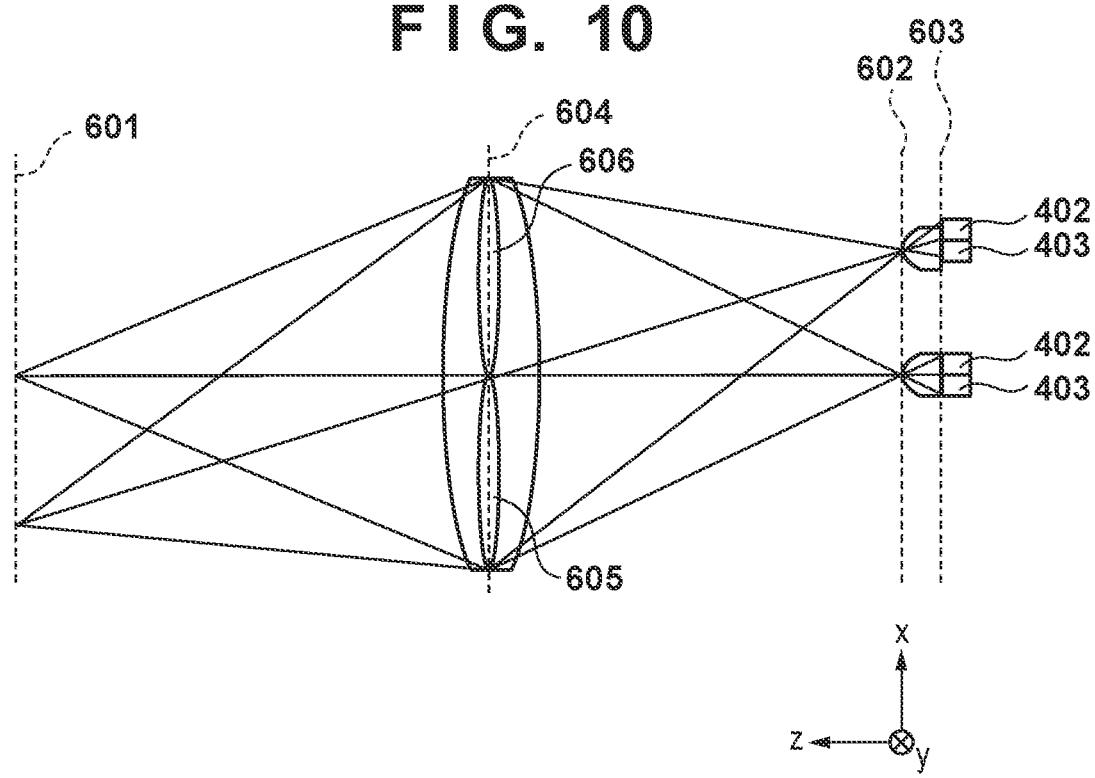
FIG. 10 is a schematic diagram of the image capturing element and a pupil division in the second embodiment.

A schematic diagram illustrating an association relationship between the image capturing element and the pupil division of the present embodiment is shown in FIG. 10. A line 601 indicates a position of a subject, and via an image capturing lens at a position 604, a subject image is formed on a surface position 602 of the image capturing element 100. Also, a reference numeral 603 indicates a position close to a surface of the photoelectric converter of the imaging pixel which constitutes the image capturing element 100. In each pixel of the image capturing element 100, the PDA 402 and the PDB 403, for which an x direction division into 2 was made, via a microlens arranged between a line 602 and a line 603, receive a beam of light passing through different pupil sub-regions: a pupil sub-region 605 and a pupil sub-region 606.

By selecting PDA 402 and PDB 403 signals of every pixel, parallax images corresponding to the pupil sub-region 605 and the pupil sub-region 606 of the image forming optical system can be obtained. Also, by adding all the PDA 402 and PDB 403 signals of every pixel, a captured image with a resolution of an effective number of pixels can be generated.

A relationship between an image misalignment amount and a defocus amount of the parallax images in the present embodiment is described in the following.

Figure 11:
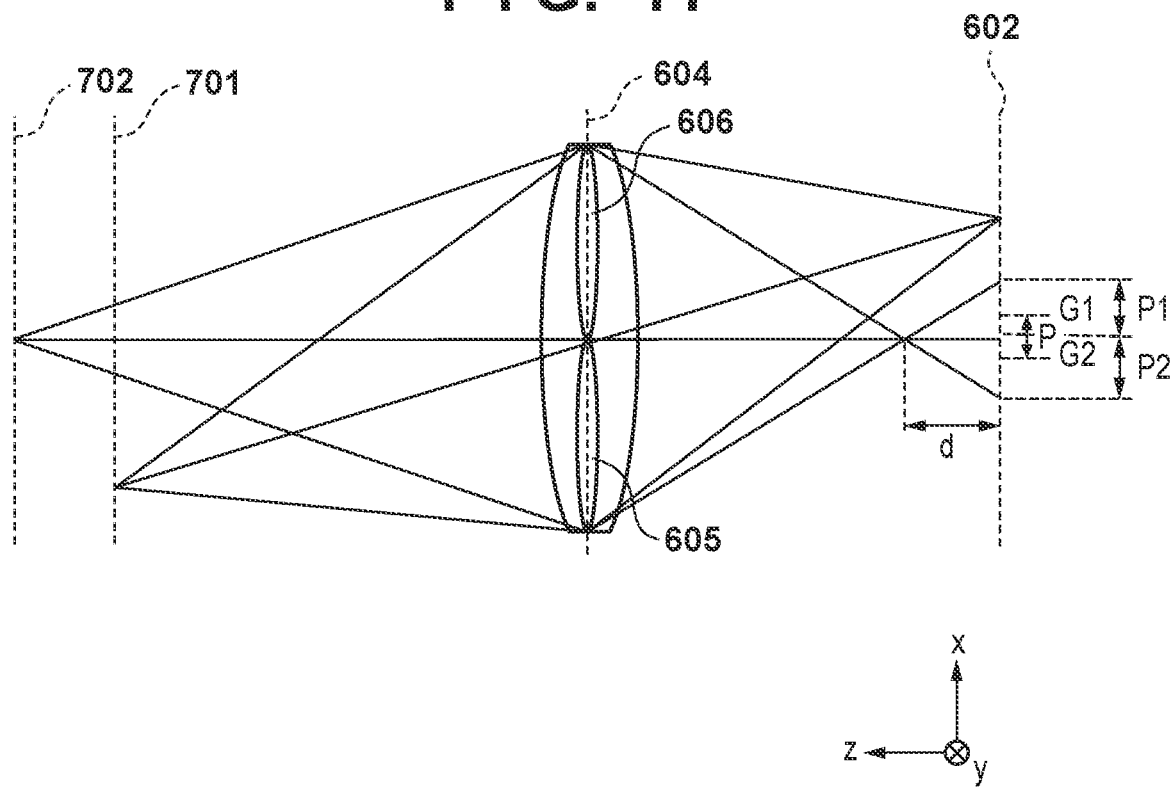
FIG. 11 is a schematic diagram of an image misalignment amount and a defocus amount in the second embodiment.

In FIG. 11 a summarized relationship between the image misalignment amount and the defocus amount of the parallax images is illustrated. The image capturing element of the present embodiment is arranged on an image capturing plane 602, and similarly to FIG. 10, an exit pupil of the image forming optical system is divided into two parts: the pupil sub-region 605 and the pupil sub-region 606.

A distance from an imaging position of the subject to the image capturing plane is a magnitude of the defocus amount d, and a front-focused state where the imaging position of the subject to the image capturing plane is on a subject side is defined to have a negative sign (d<0) and a rear-focused state where the imaging position of the subject to the image capturing plane is on an opposite side from the subject side is defined as to have a positive sign (d>0). An in-focus state where the imaging position of the subject is on the image capturing plane is d=0. In FIG. 11, a subject 701 indicates an example of an in-focus state (d=0), and a subject 702 indicates an example of a front-focused state (d<0). The front-focused state (d<0) and the rear-focused state (d>0) are both referred to as a defocused state (|d|>0).

In the front-focused state (d<0), beam of lights that pass the pupil sub-region 605 (606) among beams of light from the subject 702, after first being focused, spread to a width P1 (P2) with a center-of-gravity position G1 (G2) of the beam of light as the center, an form an out-of-focus image on the image capturing plane 602. The out-of-focus image is received by the PDA 402 and the PDB 403 and the parallax images are generated. Accordingly, on the parallax images generated from the PDA 402 and PDB 403 signals at the center-of-gravity position G1 (G2), the subject 702 is recorded as an out-of-focus subject image for the width P1 (P2). The blur width P1 (P2) of the subject image increases roughly proportionally in conjunction with an increase in the magnitude of the defocus amount d. Similarly, the magnitude |p| of an image shift amount p (=G1−G2) of the subject image between the parallax images increases roughly proportionally in conjunction with the increase in the magnitude |d| of the defocus amount d. The same applies to the rear-focused state (d>0), although the image misalignment direction of the subject image between the parallax images is the opposite of the front-focused state. In the in-focus state (d=0), the center-of-gravity positions of the subject image between the parallax images match (p=0), so the image misalignment does not occur.

Accordingly, in two (a plurality) parallax images that can be obtained using the PDA 402 and PDB 403 signals, in conjunction with the increase in the magnitude of the defocus amount of the parallax images, the magnitude of the image misalignment amount between a plurality of parallax images will increase. By calculating the image misalignment amount between the parallax images using a correlation operation with reference to the signals of the present embodiment, a focus detection of the image-plane phase-difference detection method can be performed.

Also in the circuit configuration in FIG. 8, a TXA 404 and a TXB 405 are controlled at the same timing as the TX in FIG. 3, and by controlling other circuits similarly to in FIG. 3, the same readout operation as the first embodiment can be performed.

Also in the circuit configuration in FIG. 8, the Iload is set to be switchable, then the TXA 404 and the TXB 405 are controlled at the same timing as the TX in FIG. 7, and by controlling the other circuits similarly to FIG. 7, the same readout operation as the second conventional example can be performed.

Third Embodiment

Figure 12:
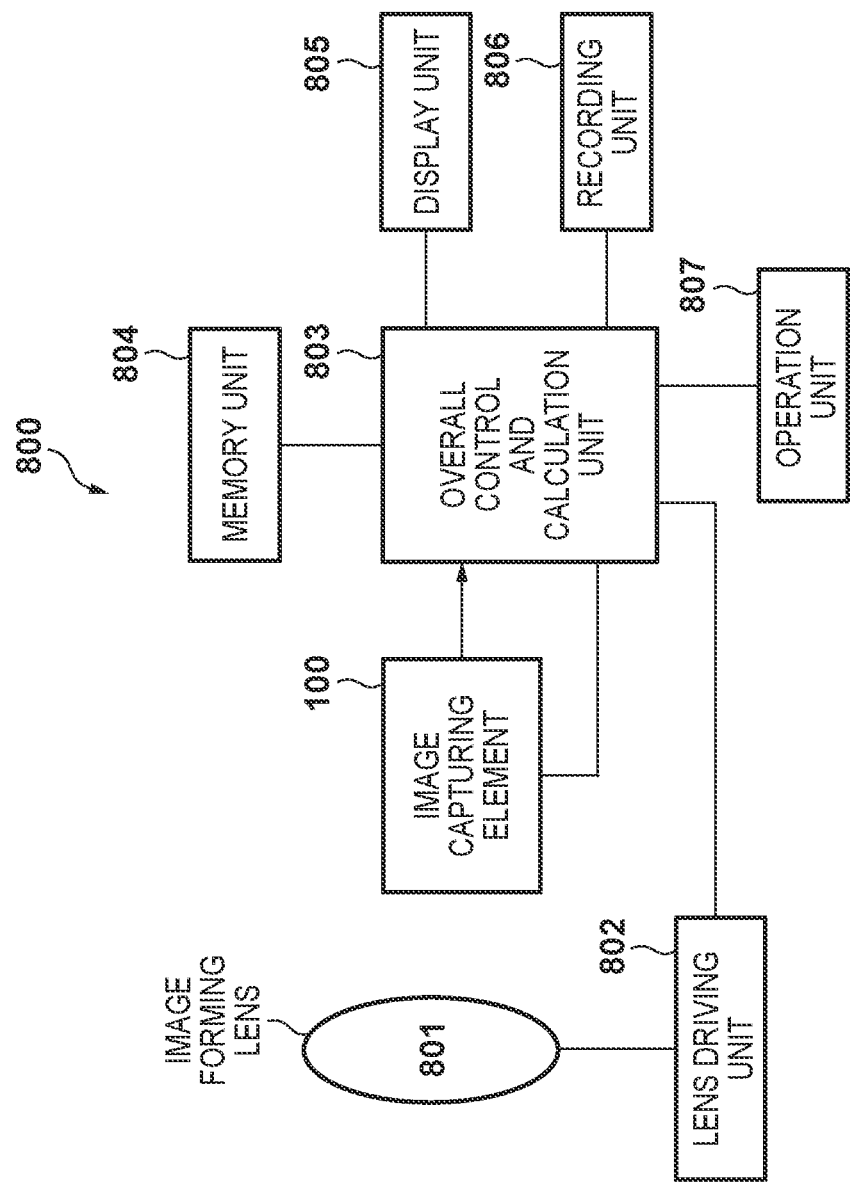
FIG. 12 is a diagram illustrating an overall configuration of the image capturing apparatus in a third embodiment.

A third embodiment is described in the following.
[Overall Configuration of Camera]
FIG. 12 is a diagram illustrating a configuration example of an image capturing apparatus 800 (for example, a digital camera) in which the image capturing element 100 of the first or second embodiment is mounted.

An image forming lens 801 causes the image capturing element 100 to form an optical image of a subject. Although the image capturing element 100 may be either of the image capturing element of the first or second embodiment, here, a configuration is assumed to comprise the pixel 401 and the AD conversion circuit 411 described in the second embodiment. A lens driving unit 802 performs zoom control, focus control, aperture control, and such of the image forming lens 801. An overall control and calculation unit 803 functions as a signal processing unit that performs processing such as correcting a signal outputted from the image capturing element 100 or generating an image and also performs overall control of the image capturing apparatus 800.

A memory unit 804 functions as a memory for temporarily storing image data. A display unit 805 is a device for displaying various types of information and images. A recording unit 806, for example, is a semiconductor memory, which can be attached/detached, for performing an image data recording or readout. An operation unit 807 is various kinds of interfaces of the image capturing apparatus, and the overall control and calculation unit 803 follows a user instruction via the operation unit 807 and controls each configuration unit of the image capturing apparatus 800. The operation unit 807 is configured to comprise a power supply switch, a shutter switch, a zoom operation switch, an image capturing mode selection switch or the like. The shutter switch turns on by having a shutter button (not illustrated) half-pressed and comprises an image capturing preparation switch SW1 which causes processing such as AF (auto focus) or the like to start. Also, the shutter switch turns on by having the shutter button fully pressed and comprises an image capturing instruction switch SW2 which causes image capturing to start.

A signal readout operation of the image capturing element 100 uses three types of readout operations according to a purpose of a read signal. One is the readout operation in FIG. 3 which in the present embodiment is referred to as a low power consumption image signal readout. Another one is the readout operation in FIG. 9 which in the present embodiment is referred to as a low power consumption phase-difference signal readout. Yet another one is the readout operation in FIG. 7, which in the present embodiment is referred to as a high-speed image signal readout.

Figure 13:
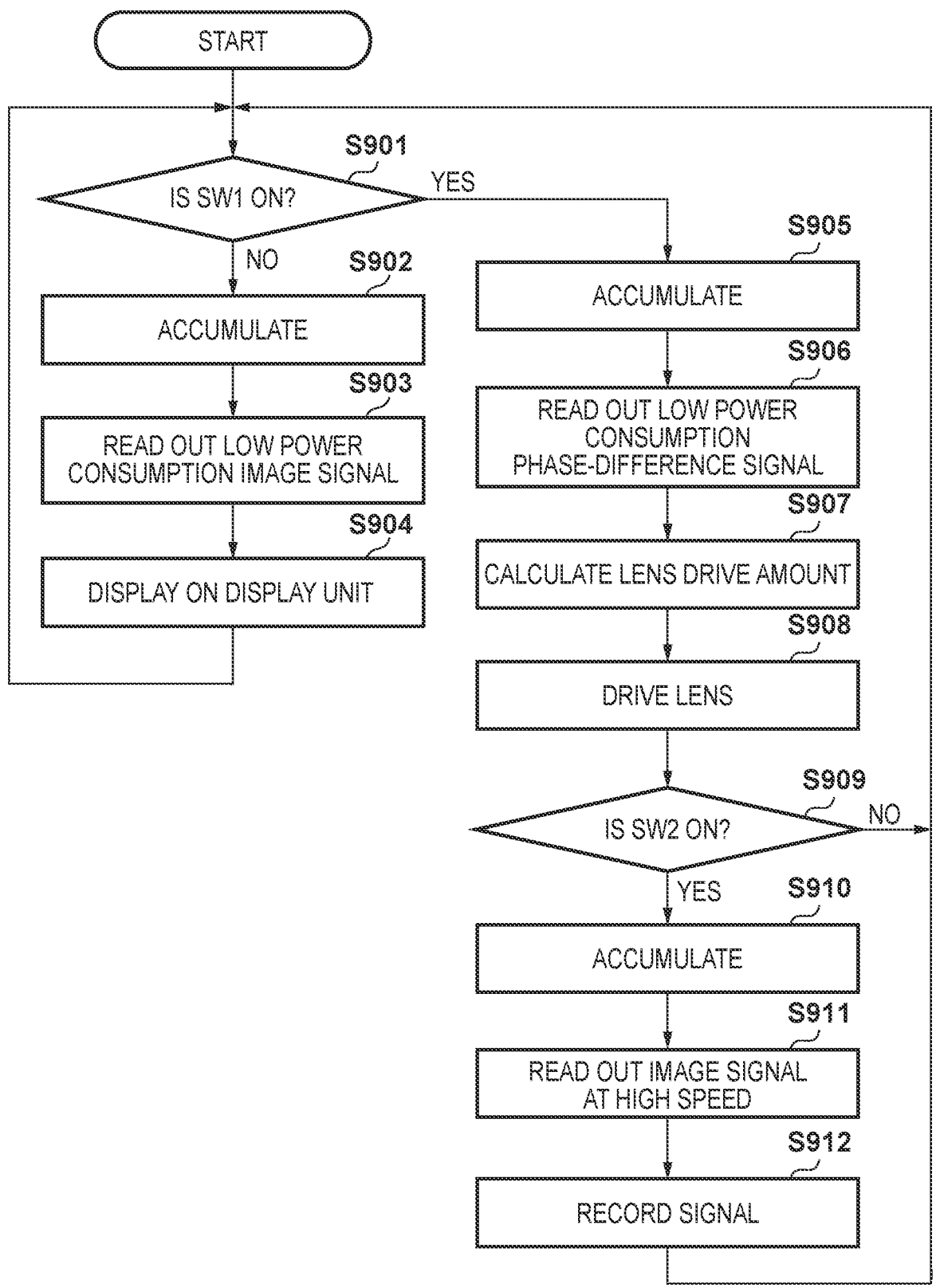
FIG. 13 is a diagram illustrating a camera operation sequence of the image capturing apparatus in a third embodiment.

[Camera Operation Sequence]
FIG. 13 is an example of a flowchart illustrating an operation of a subject tracking AF continuous shooting in the present embodiment, and the subject tracking AF continuous shooting is described with reference to FIG. 13. A shooting mode is assumed to be in a subject tracking AF continuous shooting mode in accordance with a user operation of the image capturing mode selection switch comprised by the operation unit 807.

First, in step S901, the overall control and calculation unit 803 determines whether or not the image capturing preparation switch SW1 is turned on. If the switch is off, the processing proceeds to step S902 and if on, then proceeds to step S905.

In step S902, a charge accumulation is started in the photoelectric converter. Next, in step S903, a display signal readout is performed. Steps S902 to S904 are operations repeatedly performed when in the subject tracking AF continuous shooting mode, when the SW1 is off, and when the SW2 is off, and it is desirable for power consumption to be reduced. Also, the display signal (a non-recording image signal) has a lower number of pixels read out than the recording signal (a recording image signal), and a limitation on the readout time is small. Thus, the readout is performed by the low power consumption image signal readout. The read signal is displayed on the display unit in step S904.

In step S905, a charge accumulation is started in the photoelectric converter. In step S906, the low power consumption phase-difference signal readout is performed. In step S907, based on the signal readout in step S906, the overall control and calculation unit 803 obtains a defocus amount then calculates the lens drive amount.

In step S908, based on the lens drive amount calculated in step S907, the lens driving unit 802 shifts a focus lens group of the image forming lens 801 to an in-focus position.

In step S909, the overall control and calculation unit 803 determines whether or not a shooting instruction switch SW2 is turned on. If the switch is off, the processing proceeds to step S910 and if on, then returns to step S901.

In step S910, a charge accumulation is started in the photoelectric converter. In step S911, a readout time is prioritized, thereby a high-speed image signal readout is performed.

In step S912, the overall control and calculation unit 803 records the read signal to the recording unit 806, then the processing returns to step S901.

As described above, according to the above embodiment, by switching the readout operation of the image capturing element, the power consumption related to the pixel signal readout can be reduced.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-161462, filed Sep. 4, 2019 which is hereby incorporated by reference herein in its entirety.

What is claimed is:

1. An image capturing apparatus comprising:
a pixel array in which a plurality of pixels are arranged in a form of a two-dimensional array;
an AD converter configured to AD-convert a voltage;
an output line configured to connect the pixel and the AD converter;
a reset circuit configured to reset a voltage of the output line;
an amplification transistor configured to amplify a signal from a charge-voltage converter of the pixel;
a connection circuit configured to connect a source of the amplification transistor to the output line;
a constant current source configured to supply a constant current to the output line; and
a controller configured to, after a voltage of the output line is reset by the reset circuit, cause a constant current to flow to the output line by the constant current source and to control to connect a source of the amplification transistor to the output line,
wherein the controller sets a value of the constant current so that a current value of the constant current is a lower value than a current value required to drive the output line.

2. The image capturing apparatus according to claim 1, wherein the pixel comprises a transfer switch configured to transfer a charge accumulated in a photoelectric converter to the charge-voltage converter, and the controller performs a pixel signal readout respectively before and after performance of a transfer operation for turning the transfer switch on and off.

3. The image capturing apparatus according to claim 1, wherein each of the pixels respectively comprises one microlens and a plurality of photoelectric converters.

4. The image capturing apparatus according to claim 1, wherein a reference voltage of the output line is a ground voltage.

5. The image capturing apparatus according to claim 1, wherein a reference voltage of the output line is a value determined from a lower limit of a voltage range of an AD conversion.

6. The image capturing apparatus according to claim 1, wherein a reference voltage of the output line is a value determined from a voltage corresponding to an expected maximum light amount.

7. The image capturing apparatus according to claim 1, wherein the controller performs a switch between a first operation in which a reset operation for resetting a voltage of the output line is performed by the reset circuit and then a pixel signal is read out and a second operation in which a pixel signal is read out without the reset operation being performed.

8. The image capturing apparatus according to claim 7, wherein a current supplied by the constant current source in the first operation is smaller than a current supplied by the constant current source in the second operation.

9. The image capturing apparatus according to claim 7, wherein the controller, for when a reset transistor for resetting the charge-voltage converter is turned on, switches a voltage applied to a gate of the reset transistor between the first operation and the second operation.

10. The image capturing apparatus according to claim 7, wherein the AD converter comprises a comparator and a generation circuit of a RAMP signal, and the generation circuit, in the first operation, changes the RAMP signal from a low voltage to a high voltage and in the second operation, changes the RAMP signal from a high voltage to a low voltage.

11. The image capturing apparatus according to claim 7, wherein the controller employs a signal that is read out by the first operation as a non-recording signal and a signal that is read out by the second operation as a recording signal.

12. A method for controlling an image capturing apparatus having a pixel array in which a plurality of pixels are arranged in a form of a two-dimensional array, an AD converter configured to AD-convert a voltage, an output line configured to connect the pixel and the AD converter, a reset circuit configured to reset a voltage of the output line, an amplification transistor configured to amplify a signal from a charge-voltage converter of the pixel, a connection circuit configured to connect a source of the amplification transistor to the output line, and a constant current source configured to supply a constant current to the output line, the method comprising:
controlling to cause a constant current to flow to the output line by the constant current source and to connect a source of the amplification transistor in the output line after a voltage of the output line is reset by the reset circuit, wherein in the controlling, a value of the constant current is set so that a current value of the constant current is a lower value than a current value required to drive the output line.

13. A non-transitory computer-readable storage medium on which is stored a program for causing a computer to execute each step of a method for controlling an image capturing apparatus having a pixel array in which a plurality of pixels are arranged in a form of a two-dimensional array, an AD converter configured to AD-convert a voltage, an output line configured to connect the pixel and the AD converter, a reset circuit configured to reset a voltage of the output line, an amplification transistor configured to amplify a signal from a charge-voltage converter of the pixel, a connection circuit configured to connect a source of the amplification transistor to the output line, and a constant current source configured to supply a constant current to the output line, the method comprising:
controlling to cause a constant current to flow to the output line by the constant current source and to connect a source of the amplification transistor to the output line after a voltage of the output line is reset by the reset circuit, wherein in the controlling, a value of the constant current is set so that a current value of the constant current is a lower value than a current value required to drive the output line.

\* \* \* \* \*